(12) United States Patent
Lee et al.

(10) Patent No.: US 7,968,882 B2
(45) Date of Patent: Jun. 28, 2011

(54) FLEXIBLE DISPLAY DEVICE AND MANUFACTURING METHOD THEREOF

(75) Inventors: Jae Gu Lee, Gumi-si (KR); Seung Chul Kang, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 452 days.

(21) Appl. No.: 12/245,188

(22) Filed: Oct. 3, 2008

(65) Prior Publication Data

US 2009/0289255 A1 Nov. 26, 2009

(30) Foreign Application Priority Data

May 23, 2008 (KR) .................. 10-2008-0048042

(51) Int. Cl.
H01L 29/04 (2006.01)
H01L 29/10 (2006.01)
H01L 29/15 (2006.01)

(52) U.S. Cl. ..... 257/59; 257/72; 257/350; 257/E29.151; 438/129; 438/462

(58) Field of Classification Search ............... 257/59, 257/72, 350, 620, E29.151; 438/129, 462
See application file for complete search history.

(56) References Cited

U.S. PATENT DOCUMENTS

| | | | | |
|---|---|---|---|---|
| 4,938,567 A | * | 7/1990 | Chartier | 359/245 |
| 6,160,270 A | * | 12/2000 | Holmberg et al. | 257/59 |
| 6,764,886 B2 | * | 7/2004 | Yamazaki et al. | 438/164 |
| 2003/0215973 A1 | * | 11/2003 | Yamazaki et al. | 438/48 |
| 2006/0033872 A1 | * | 2/2006 | Sasuga et al. | 349/149 |
| 2007/0080918 A1 | * | 4/2007 | Kawachi et al. | 345/92 |

FOREIGN PATENT DOCUMENTS

| | | |
|---|---|---|
| CN | 1614483 A | 5/2005 |
| CN | 1830079 A | 9/2006 |

OTHER PUBLICATIONS

Office Action issued in corresponding Chinese Patent Application No. 200810182344.3; issued Jun. 4, 2010.

* cited by examiner

*Primary Examiner* — Ngan Ngo
(74) *Attorney, Agent, or Firm* — Brinks Hofer Gilson & Lione

(57) ABSTRACT

A flexible display device adapted to prevent a disconnection of pad electrode and a line short-circuit is disclosed. The flexible display device and the manufacturing method thereof according to the present embodiments forms only the barrier film or no layer on the mother substrate in the vicinity of the cut line which divides the mother substrate into the TFT substrate. Even when the mother substrate is pressed using a press machine, cracks or lifts of layers are not generated in the TFT substrate unlike the conventional technology so that a disconnection is not generated in the gate pad electrode or the data pad electrode. Thus, line short-circuits generated as the layers are separated and attached to the TFT substrate can be prevented.

17 Claims, 8 Drawing Sheets

FLEXIBLE DISPLAY DEVICE AND MANUFACTURING METHOD THEREOF

CROSS-REFERENCE TO RELATED APPLICATION

Field of the Disclosure

This application claims priority under 35 U.S.C. 119 to Korean Patent Application No. 10-2008-0048042, filed on May 23, 2008, which is hereby incorporated by reference in its entirety.

BACKGROUND

1. Field of the Disclosure

This disclosure relates to a flexible display device, and more particularly to a flexible display device and a manufacturing method thereof.

2. Description of the Related Art

It is a recent trend that flexible substrates that are thin and light and exhibit superior anti-shock characteristics are widely used in the manufacture of electronic devices. Display devices using flexible substrates are liquid crystal display devices, organic electro-luminescence display devices, and electro-phoresis display devices. The flexible display devices may be applied to smart cards, wearable computers, and electronic paper.

A flexible display device includes a display panel and driving portion. The display panel includes a display zone for displaying an image through a plurality of pixels arranged in the shape of a matrix; and a non-display zone where an image is not displayed, connected to the driving portion. The driving portion includes a gate TCP (tape carrier package) where a gate driver is mounted and a data TCP where a data driver is mounted. A gate pad portion connected to the gate TCP and a data pad portion connected to the data TCP are arranged in the non-display zone. For example, an electro-phoresis display device includes a thin film transistor (TFT) substrate on which a plurality of TFTs for driving the pixels are arranged. An ink substrate having an ink layer is attached on the TFT substrate, thus forming a display panel. The TFT substrate is formed by press cutting a mother substrate.

FIG. 1 is a plan view of a flexible display device of related art. Referring to FIG. 1, a plurality of TFT substrates 3 corresponding to the size of a display panel are provided on a mother substrate 1.

FIG. 2 illustrates the structure of one of the TFT substrates 3 of FIG. 1. referring to FIG. 2, each of the TFT substrates 3 of FIG. 1 includes a display zone D in which a plurality of pixels are arranged and a non-display zone ND in which a plurality of gate pad portions 12 and a plurality of data pad portions 16 are arranged. In the display zone D, a plurality of gate lines 10 and a plurality of data lines 14 are arranged crossing each other. A plurality of pixels P are defined as the gate lines 10 and the data lines 14 cross each other. A TFT 18 is connected to each of the gate lines 10 and each of the data lines 14 arranged in each pixel P. The gate pad portions 12 in the non-display zone ND are connected to the gate lines 10 in the display zone D. The data pad portions 16 in the non-display zone ND are connected to the data lines 14 in the display zone D.

FIG. 3 is a cross-sectional view showing a TFT region of each pixel and the gate pad region 12 and the data pad region 16 in the non-display zone ND. Referring to FIG. 3, a barrier film 23 formed of an insulation material is formed on the mother substrate 1 that is flexible and formed of metal. The barrier film 23 is formed to prevent electric short-circuits between the mother substrate 1 and the gate lines 10, a gate electrode 25, and a gate pad electrode 27, which will be formed later.

The gate lines 10, the gate electrode 25, and the gate pad electrode 27 are formed on the barrier film 23, and a gate insulation film 29 is formed on the barrier film 23 in which the gate lines 10, the gate electrode 25, and the gate pad electrode 27 are provided. A semiconductor layer 31 is formed on the gate insulation film 29 corresponding to the gate electrode 25.

The data lines 14, source and drain electrodes 33 and 35, and a data pad electrode 37 are formed on the mother substrate 1 including the semiconductor layer 31. Next, a protective film 39 is formed on the mother substrate 1 with the semiconductor layer 31. Then, a pixel electrode 41, a gate contact electrode 43, and a data contact electrode 45 are formed on the protection film 39. The pixel electrode 41 is connected to the drain electrode 35, the gate contact electrode 43 is connected to the gate pad electrode 27, and the data contact electrode 45 is connected to the data pad electrode 37.

Accordingly, the barrier film 23, the gate pad electrode 27, the gate insulation film 29, the protection film 39, and the gate contact electrode 43 are formed in a gate pad region. Also, the barrier film 23, the gate insulation film 29, the data pad electrode 37, the protection film 39, and the data contact electrode 45 are formed in a data pad region.

After the TFT 18, the gate pad portions 12, and the data pad portions 16 are formed, the mother substrate 1 undergoes a cutting process. Since the mother substrate 1 is formed of metal, the mother substrate 1 is cut using a press machine. That is, as shown in FIG. 4, when the mother substrate 1 is accommodated on a support 51, the mother substrate 1 is pressed by a presser 53 to be physically cut so that a TFT substrate is manufactured. Thus, the gate pad region or the data pad region is positioned at a portion to be cut.

Accordingly, when the mother substrate is cut by being physically pressed in the press machine, an edge portion of the TFT substrate is burred or crashed, which may lift each layer of the substrate or generate cracks or disconnection lines in the substrate. Furthermore, during the pressing process, the layers of the substrate in the vicinity of a cut line may be separated and attached to the TFT substrate so that line short-circuits can be generated.

BRIEF SUMMARY

Accordingly, the present embodiments are directed to a flexible display device and a manufacturing method thereof that substantially obviate one or more of problems due to the limitations and disadvantages of the related art, and a manufacturing method thereof.

According to one general aspect of the present embodiment, a flexible display device includes: a mother substrate having a cut line which divides the mother substrate into a plurality of TFT substrates, a barrier film formed on the mother substrate, a gate line formed on the barrier film, a data line defining a pixel by crossing the gate line, a TFT connected to the gate line and the data line, a gate pad electrode connected to the gate line and formed on a gate pad region, a data pad electrode connected to the data line and formed on a data pad region, a pixel electrode connected to the TFT, a gate insulation film formed under the data line and the data pad electrode, a protection film formed on the pixel electrode, a gate contact electrode formed in the gate pad region and connected to the gate pad electrode with the protection film interposed between the gate contact electrode and the gate pad electrode, and a data contact electrode formed in the data pad region and connected to the data pad electrode with the protection film interposed between the data contact electrode and the data pad electrode, wherein only the barrier film is formed on the mother substrate in an area in the vicinity of the cut line.

A flexible display device according to another general aspect of the present embodiment includes: a mother substrate having a cut line which divides the mother substrate into a plurality of TFT substrates, a barrier film formed on the mother substrate, a gate line formed on the barrier film, a data line defining a pixel by crossing the gate line, a TFT connected to the gate line and the data line, a gate pad electrode connected to the gate line and formed on a gate pad region, a data pad electrode connected to the data line and formed on a data pad region, a pixel electrode connected to the TFT, a gate insulation film formed under the data line and the data pad electrode, a protection film formed on the pixel electrode, a gate contact electrode formed in the gate pad region and connected to the gate pad electrode with the protection film interposed between the gate contact electrode and the gate pad electrode, and a data contact electrode formed in the data pad region and connected to the data pad electrode with the protection film interposed between the data contact electrode and the data pad electrode, wherein the gate insulation film, the gate pad electrode, the data pad electrode, the protection film, the gate pad electrode, and the data pad electrode are not on the mother substrate in the area in the vicinity of the cut line.

A method of manufacturing a flexible display device according to still another general aspect of the present embodiment includes the steps of: providing a mother substrate having a cut line along which the mother substrate is cut into a plurality of TFT substrates, forming a barrier film on the mother substrate and removing the barrier film from an area in the vicinity of the cut line, forming a gate line, a gate electrode, and a gate pad electrode on the barrier film and removing the gate pad electrode from the area in the vicinity of the cut line, forming a gate insulation film on the mother substrate including the gate line, the gate electrode, and the gate pad electrode and removing the gate pad electrode from the area in the vicinity of the cut line, forming a data line, source and drain electrodes, and a data pad electrode on the gate insulation film and removing the data pad electrode from the area in the vicinity of the cut line, forming a protection film having at least one contact hole on the mother substrate including the data line, the source and drain electrodes, and the data pad electrode and removing the protection film from the area in the vicinity of the cut line, and forming a pixel electrode, a gate contact electrode, and a data contact electrode on the protection film and removing the gate contact electrode and the data contact electrode from the area in the vicinity of the cut line.

A method of manufacturing a flexible display device according to further still another general aspect of the present embodiment includes the steps of: providing a mother substrate having a cut line along which the mother substrate is cut into a plurality of TFT substrates, forming a barrier film on the mother substrate, forming a gate line, a gate electrode, and a gate pad electrode on the barrier film and removing the gate pad electrode from the area in the vicinity of the cut line, forming a gate insulation film on the mother substrate including the gate line, the gate electrode, and the gate pad electrode and removing the gate pad electrode from the area in the vicinity of the cut line, forming a data line, source and drain electrodes, and a data pad electrode on the gate insulation film and removing the data pad electrode from the area in the vicinity of the cut line, forming a protection film having at least one contact hole on the mother substrate including the data line, the source and drain electrodes, and the data pad electrode and removing the protection film from the area in the vicinity of the cut line, and forming a pixel electrode, a gate contact electrode, and a data contact electrode on the protection film and removing the gate contact electrode and the data contact electrode from the area in the vicinity of the cut line.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts.

Figure 1:
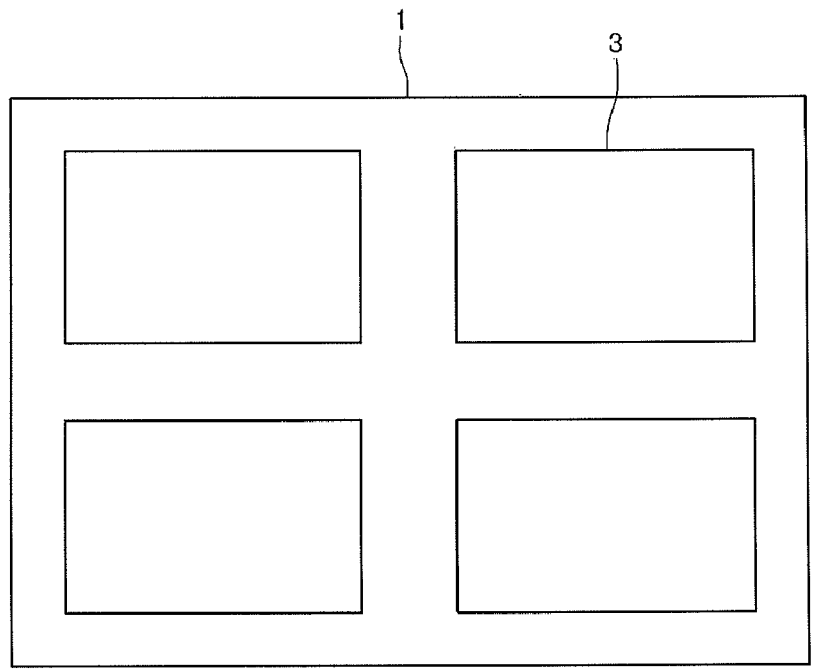
FIG. 1 is a plan view showing a flexible display device of related art.
Figure 2:
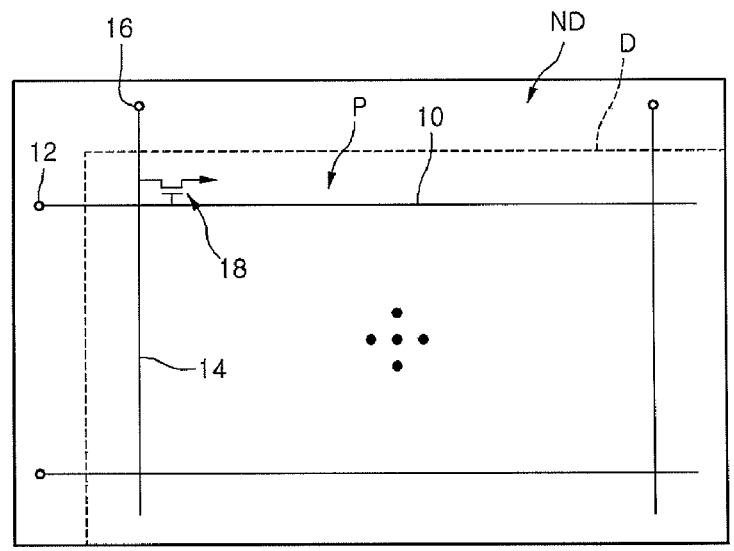
FIG. 2 is a view showing a TFT substrate of FIG. 1.
Figure 3:
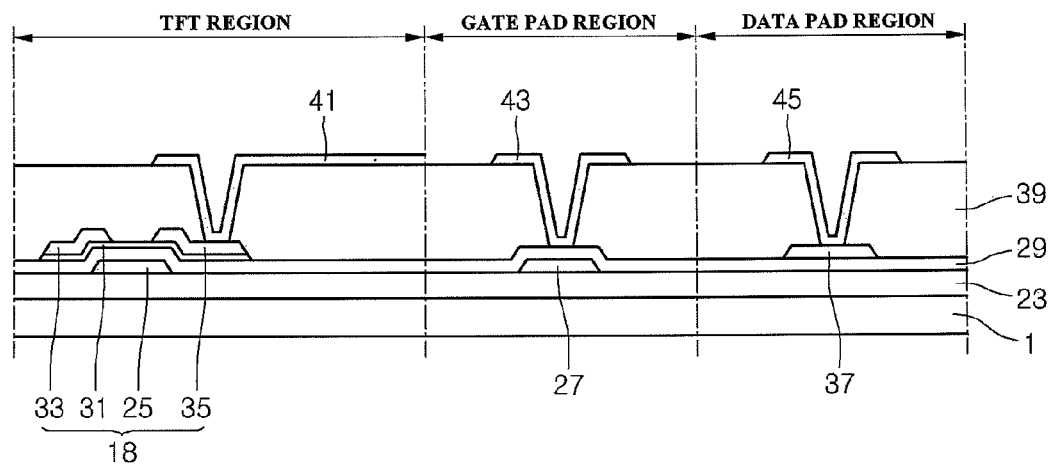
FIG. 3 is a sectional view showing a TFT region of each pixel and a gate pad region and a data pad region in the non-display zone.
Figure 4:
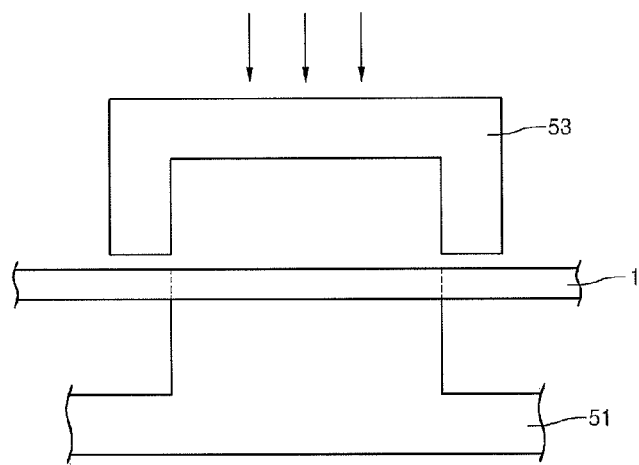
FIG. 4 is a sectional view showing a press machine which cut a mother substrate.
Figure 5:
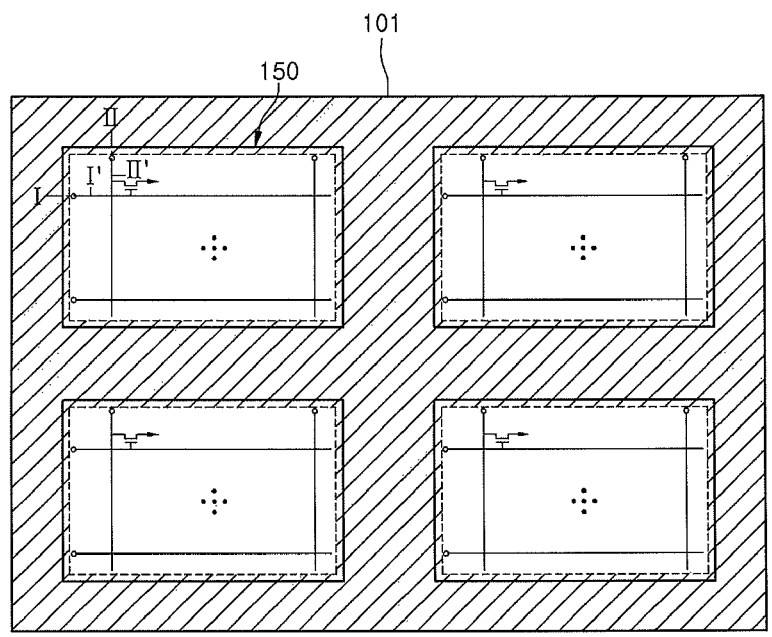
FIG. 5 is a plan view of a flexible display device according to an embodiment of the present disclosure.

FIG. 5 is a plan view of a flexible display device according to an embodiment of the present disclosure. Referring to FIG. 5, a plurality of TFT substrates are provided on a mother substrate 101. A TFT substrate may be manufactured by forming a TFT, a gate pad portion, and a data pad portion on the TFT substrate in a predetermined process, cutting the TFT substrate along a cut line 150 using a press process.

Figure 6:
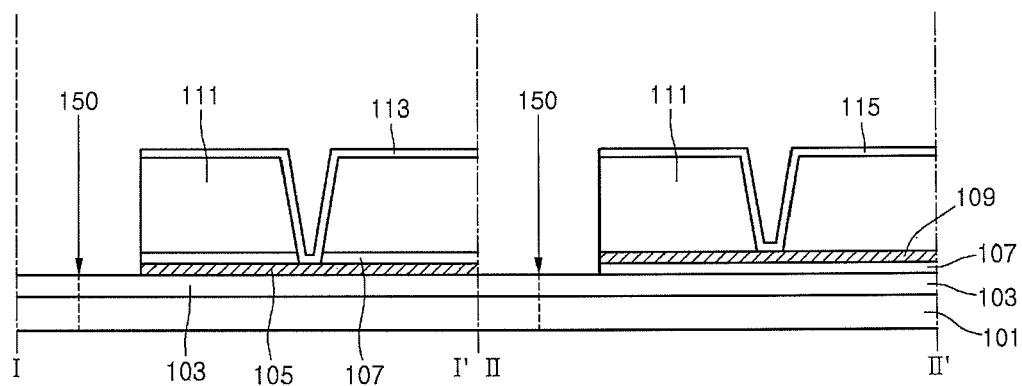
FIG. 6 is a sectional view showing a flexible display device taken along line I-I' and II-II' of FIG. 5.

FIG. 6 is a sectional view showing a flexible display device taken along line I-I' and II-II' of FIG. 5. Referring to FIGS. 5 and 6, a barrier film 103 is formed on the mother substrate 101 using an insulation material. The mother substrate 101 may be formed of metal. The metal may be stainless steel that is cheap and light and has high rigidity. Accordingly, the stainless steel is suitable for a flexible substrate.

The barrier film 103 may be formed to prevent electric short-circuits between the mother substrate 101 and a gate line, a gate electrode, and a gate pad electrode 105 which will be formed later. Since the barrier film 103 needs to be relatively thick, the barrier film 103 may be formed of an organic material exhibiting an insulation characteristic that can be thickly formed easily. The gate line, the gate electrode, and the gate pad electrode 105 are formed on and above the barrier film 103. The gate line, the gate electrode, and the gate pad electrode 105 may be formed integrally.

The gate pad electrode 105 may be formed in the gate pad region in the non-display zone. The gate line and the gate electrode may be formed in the display zone. A gate insulation film 107 is formed on the gate line, the gate electrode, and the gate pad electrode 105. A semiconductor layer and source/drain electrodes are formed on the corresponding gate insulation film 107 to the gate electrode. Thus, a TFT may be formed by the gate electrode, the semiconductor layer, and the source/drain electrodes.

A data line and a data pad electrode 109 may be formed on the same layer as the source/drain electrodes. The source/drain electrodes, the data line, and the data pad electrode 109 may be formed in a body. Thus, the TFT can be connected to the gate line and the data line.

The data pad electrode 109 may be formed in the data pad region in the non-display zone. The data line and the source/drain electrodes may be formed in the display zone. The gate line and the data line cross each other so that a pixel is defined. A plurality of pixels may be arranged in the shape of a matrix on the display zone.

A protection film 111 having a drain contact hole through which the drain electrode is exposed, a gate contact hole 131 through which the gate pad electrode 105 is exposed, and a data contact hole 133 through which the data pad electrode 109 is exposed is formed above the substrate 101. A pixel electrode, a gate contact electrode 113, and a data contact electrode 115 are formed on the protection film 111. The pixel electrode, the gate contact electrode 113, and the data contact electrode 115 may be formed of a transparent metal material, for example, ITO or IZO.

The pixel electrode is electrically connected to the drain electrode via the drain contact hole. The gate contact electrode 113 is electrically connected to the gate pad electrode 105 via the gate contact hole 131. The data contact electrode 115 is electrically connected to the data pad electrode 109 via the data contact hole 133. Thus, the gate pad portion is formed by the gate pad electrode 105 and the gate contact electrode 113. The data pad portion is formed by the data pad electrode 109 and the data contact electrode 115.

Each layer from the gate line to the pixel electrode may be formed in a typical manufacturing method. In the present embodiment, each layer on the barrier film 103 in the vicinity of the cut line 150 is removed. The area in the vicinity of the cut line 150 includes an inner area and an outer area divided by the cut line 150. The inner area signifies a portion between the cut line 150 and the gate pad portion or the data pad portion, while the outer area signifies a portion between the cut line 150 of the neighboring TFT substrates.

Each layer may be the gate pad electrode 105, the gate insulation film 107, the data pad electrode 109, the protection film 111, the gate contact electrode 113, and the data contact electrode 115. As each layer on the barrier film 103 in the vicinity of the cut line 150 is removed, only the barrier film 103 is left on the mother substrate 101 near the cut line 150.

When the TFT substrate is manufactured by cutting the mother substrate 101 along the cut line 150, only the barrier film 103 exists in the vicinity of the cut line 150. Accordingly, when a press machine presses the mother substrate 101 along the cut line 150, since a layer exists on the barrier film 103, no cracks or lifts are generated in any layers on and above the barrier film 103. Thus, a disconnection of the gate pad electrode 105 or the data pad electrode 109 is not generated.

Also, since a layer does not exist on the barrier film 103 in the area of the cut line 150, line short-circuits that are generated as the layers on the barrier film 103 in the vicinity of the cut line 150 are separated by being pressed and attached to the TFT substrate can be prevented.

Figure 7A:
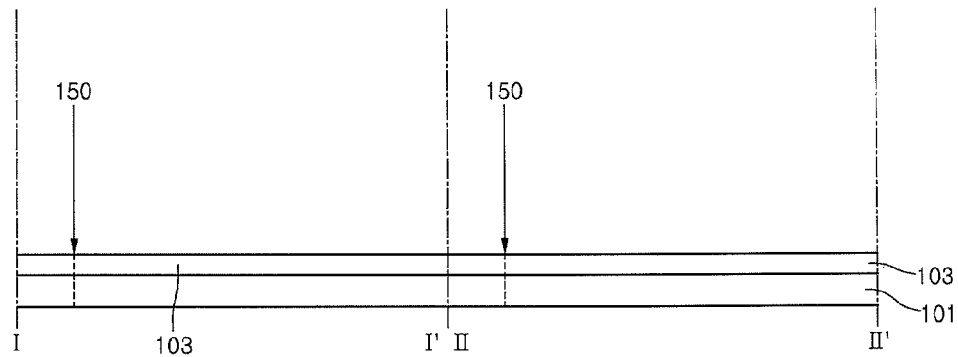
FIGS. 7A-7F are process views explaining a method of manufacturing a flexible display device according to an embodiment of the present disclosure.

FIGS. 7A-7F are process views showing a method of manufacturing a flexible display device according to an embodiment of the present disclosure. Referring to FIG. 7A, the barrier film 103 is formed of an organic insulation material on the mother substrate 101. The barrier film 103 may be formed on the overall surface of the mother substrate 101 including the area in the vicinity of the cut line 150. The mother substrate 101 may be formed of a metal material which may be stainless steel.

Figure 7B:
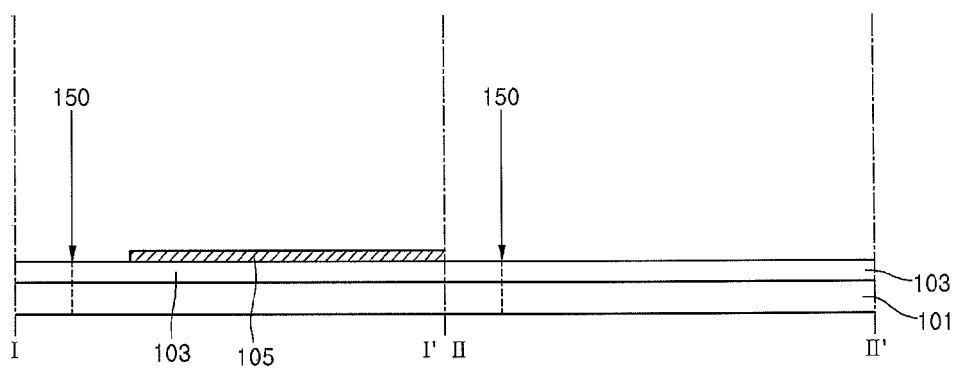

Referring to FIG. 7B, the gate line, the gate electrode, and the gate pad electrode 105 are formed on the barrier film 103. The gate pad electrode 105 in the area near of the cut line 150 is removed. The gate pad electrode 105 is formed in the gate pad region adjacent to the cut line 150.

As described above, the area in the vicinity of the cut line 150 includes the inner area and outer area divided by the cut line 150. The inner area is located between the cut line 150 and the gate pad portion or the data pad portion while the outer area is located between the cut lines 150 of the neighboring TFT substrates.

Figure 7C:
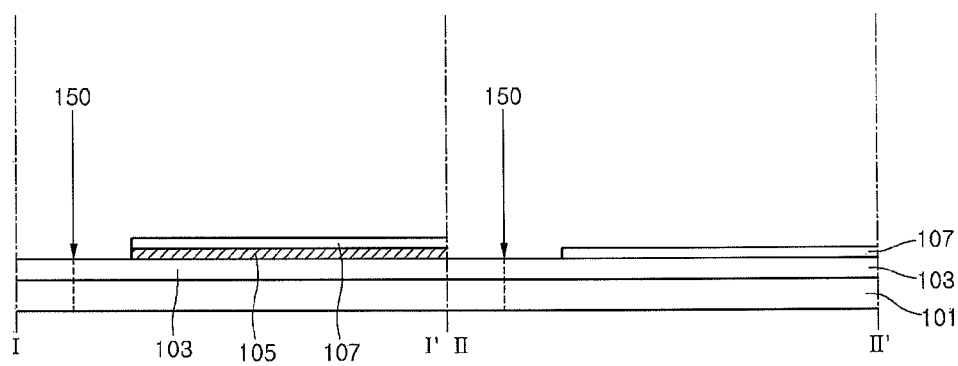

Referring to FIG. 7C, the gate insulation film 107 is formed on the mother substrate 101 including the gate line, the gate electrode, and the gate pad electrode 105. The gate pad electrode 105 in the vicinity of the cut line 150 is removed.

Figure 7D:
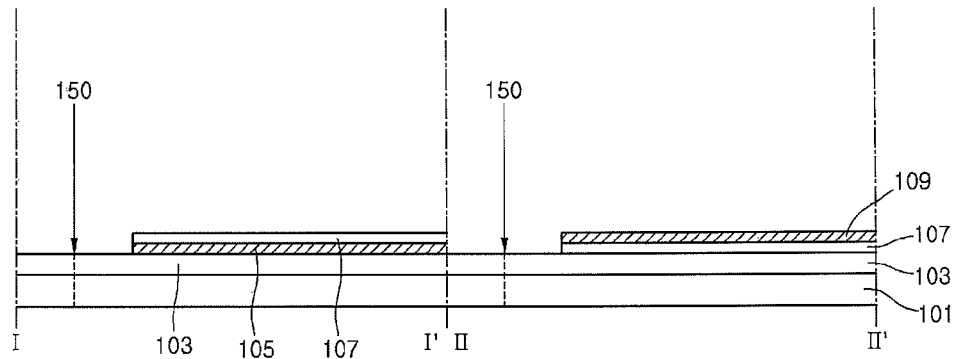

As shown in FIG. 7D, the data line, the source/drain electrodes, and the data pad electrode 109 are formed on the gate insulation film 107. The data pad electrode 109 in the area in the vicinity of the cut line 150 is removed.

Figure 7E:
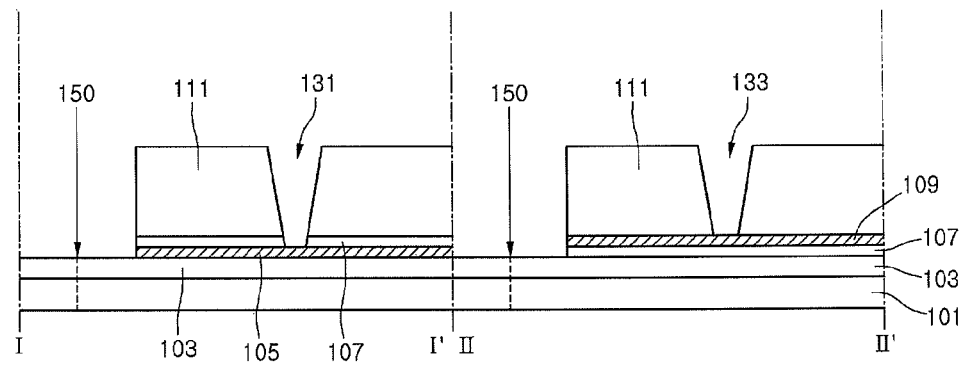

Referring to FIG. 7E, the protection film 111 is formed on the mother substrate 101 including the data line, the source/drain electrode, and the data pad electrode 109. The protection film 111 in the vicinity of the cut line 150 is removed. The drain contact hole through which the drain electrode is exposed, the gate contact hole 131 through which the gate pad electrode 105 is exposed, and the data contact hole 133 through which the data pad electrode 109 is exposed are formed in the protection film 111. When the drain contact hole, the gate contact hole 131, and the data contact hole 133 are formed, the protection film 111 in the vicinity of the cut line 150 may be removed at the same time.

Figure 7F:
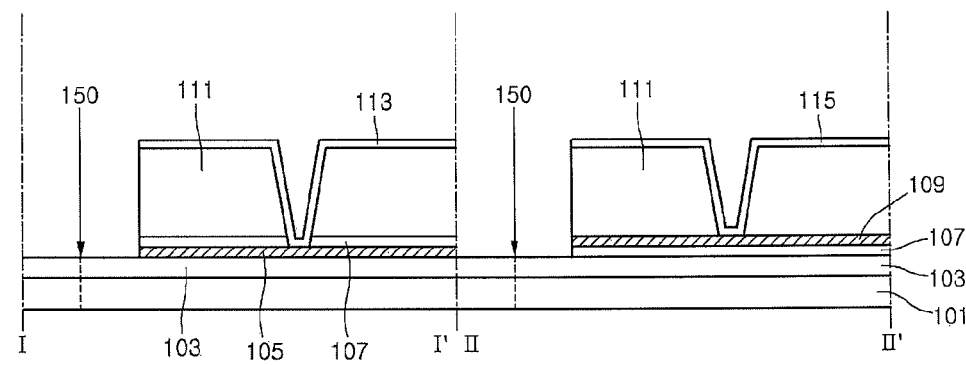

Referring to FIG. 7F, the pixel electrode, the gate contact electrode 113, and the data contact electrode 115 are formed on the protection film 111. The gate contact electrode 113 and the data contact electrode 115 are removed from the area in the vicinity of the cut line 150.

The pixel electrode is electrically connected to the drain electrode via the drain contact hole. The gate contact electrode 113 is electrically connected to the gate pad electrode 105 via the gate contact hole 131. The data contact electrode 115 is electrically connected to the data pad electrode 109 via the data contact hole 133. And then, such mother substrate 101 is cut using a press machine so that plural TFT substrates are manufactured from that.

Figure 8:
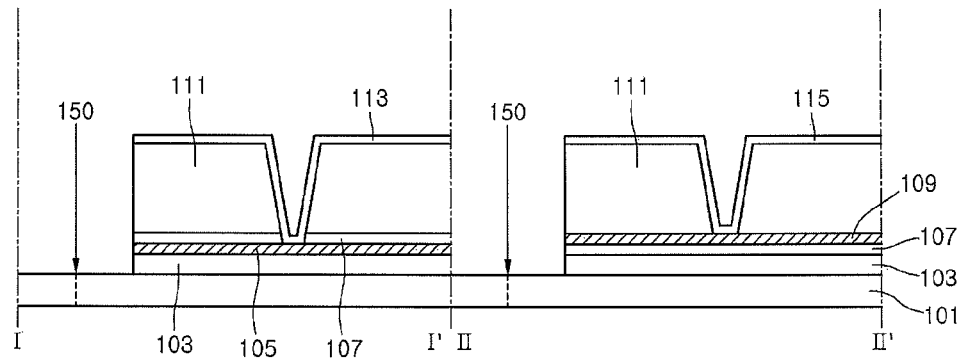
FIG. 8 is a sectional view showing a flexible display device taken along line I-I' and II-II' of FIG. 5.

FIG. 8 is a sectional view showing another flexible display device taken along line I-I' and II-II' of FIG. 5. FIG. 8 is similar to FIG. 6, except that, unlike FIG. 6, the barrier film 103 in the vicinity of the cut line 150 is removed so that no layer is formed on the mother substrate 101. When the barrier film 103 is not removed from the area in the vicinity of the cut line 150 as shown in FIG. 6, a mask process to remove the barrier film 103 is not needed so that costs can be reduced.

In contrast, when the barrier film 103 is removed from the vicinity of the cut line 150 as shown in FIG. 8, the mask process to remove the barrier film 103 is necessary so that costs are increased. However, since a layer does not exist on the mother substrate 101 in the area in the vicinity of the cut line 150, the cracks or lifts during the cutting by pressing process can be reduced compared to FIG. 6.

Figure 9A:
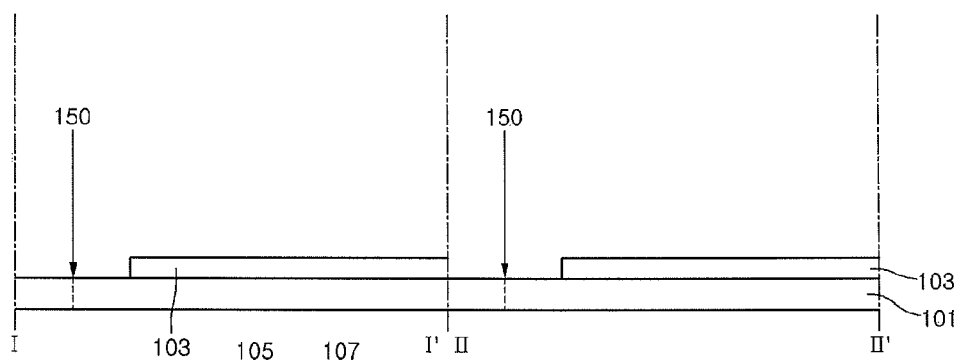
FIGS. 9A-9F are process views explaining a method of manufacturing a flexible display device according to another embodiment of the present disclosure.
Figure 9B:
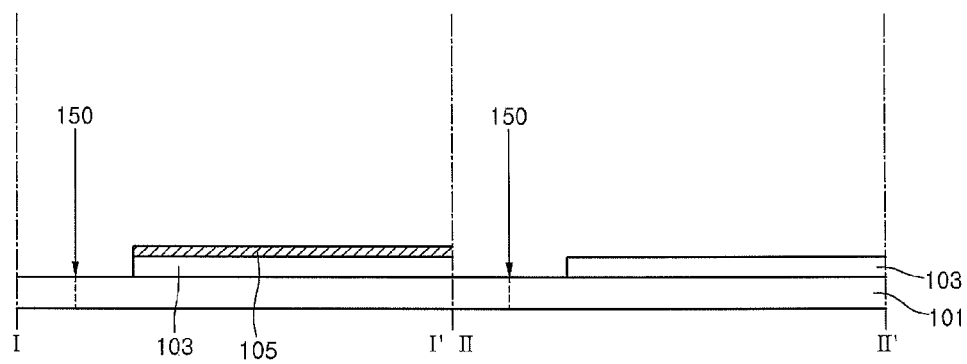
Figure 9C:
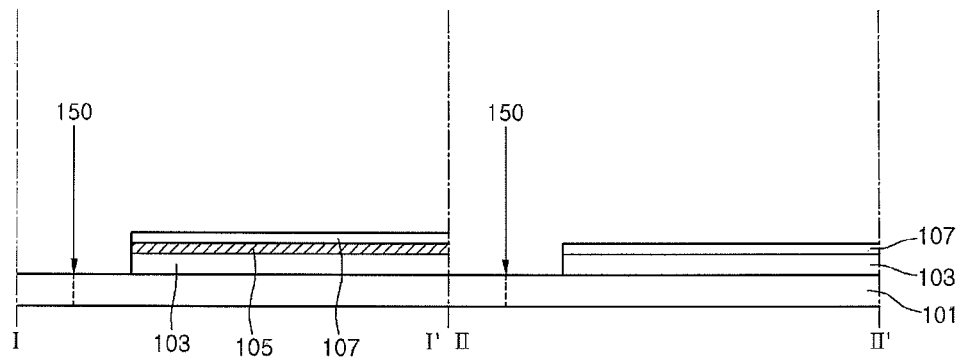
Figure 9D:
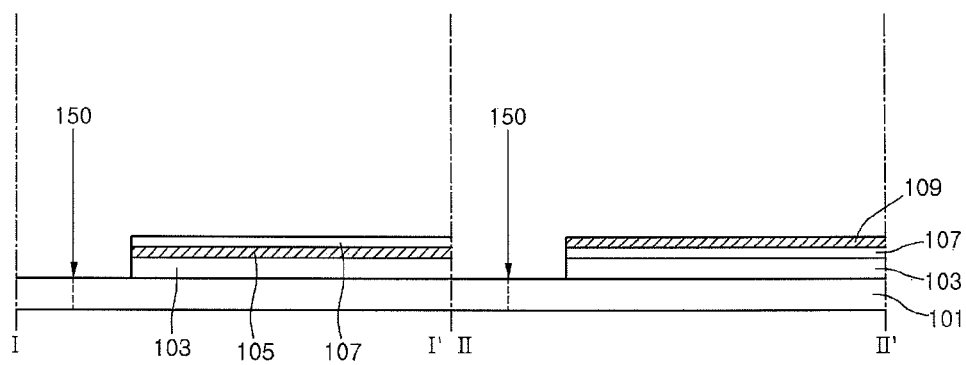
Figure 9E:
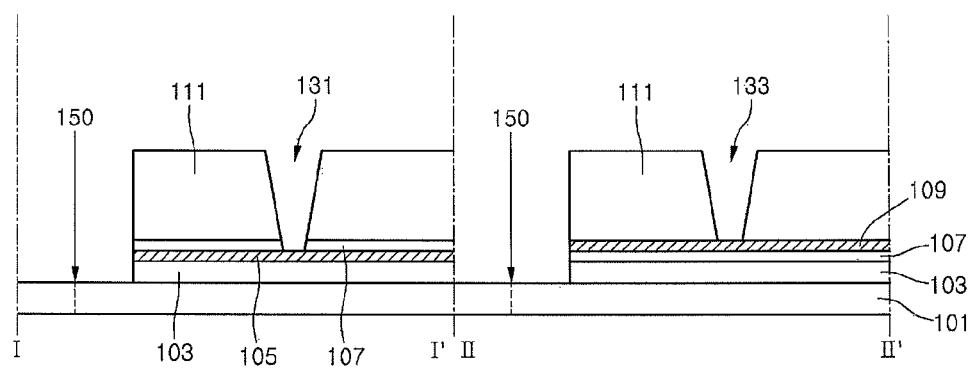
Figure 9F:
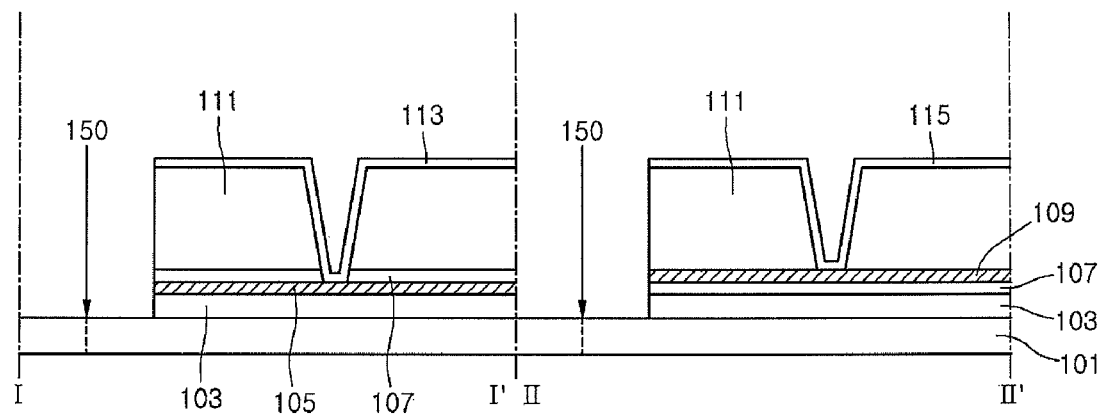

FIGS. 9A-9F are process views explaining another method of manufacturing a flexible display device according to another embodiment of the present disclosure. The manufacturing method of FIGS. 9A-9F is similar to that of FIGS. 7A-7F. However, as shown in FIG. 9A, the barrier film 103 is formed on the mother substrate 101. Then, the barrier film 103 in the area in the vicinity of the cut line 150 is removed using a mask process so that the mother substrate 101 is exposed. Since the manufacturing method of FIGS. 9B-9F is the same as that of FIGS. 7B-7F, a description thereof will be omitted herein.

As described above, the flexible display device and the manufacturing method thereof according to the present embodiments form only the barrier film or no layer on the mother substrate in the vicinity of the cut line which divides the mother substrate into the TFT substrate. Even when the mother substrate is pressed using a press machine, cracks or lifts of layers are not generated in the TFT substrate unlike the conventional technology so that a disconnection is not generated in the gate pad electrode or the data pad electrode. Thus, line short-circuits generated as the layers are separated and attached to the TFT substrate can be prevented.

It will be apparent to those skilled in the art that various modifications and variations can be made in the present embodiment. Thus, it is intended that the present embodiment cover the modifications and variations of this embodiment provided they come within the scope of the appended claims and their equivalents.

What is claimed is:

1. A flexible display device comprising:
   a mother substrate having a cut line which divides the mother substrate into a plurality of TFT substrates;
   a barrier film disposed on the mother substrate;
   a gate line disposed on the barrier film;
   a data line defining a pixel by crossing the gate line;
   a TFT connected to the gate line and the data line;
   a gate pad electrode connected to the gate line and disposed on a gate pad region;
   a data pad electrode connected to the data line and disposed on a data pad region;
   a pixel electrode connected to the TFT;
   a gate insulation film disposed under the data line and the data pad electrode;
   a protection film disposed on the pixel electrode;
   a gate contact electrode formed in the gate pad region and connected to the gate pad electrode with the protection film interposed between the gate contact electrode and the gate pad electrode; and
   a data contact electrode disposed in the data pad region and connected to the data pad electrode with the protection film interposed between the data contact electrode and the data pad electrode,
   wherein only the barrier film is on the mother substrate in the vicinity of the cut line.

2. The flexible display device claimed as claim 1, wherein the gate insulation film, the gate pad electrode, the data pad electrode, and the protection film are not on the mother substrate in the area in the vicinity of the cut line.

3. The flexible display device claimed as claim 1, wherein the mother substrate is made of flexible stainless steel.

4. The flexible display device claimed as claim 1, wherein the vicinity of the cut line comprises an inner area and an outer area.

5. The flexible display device claimed as claim 4, wherein the inner area is an area between the cut line and a gate pad portion or a data pad portion, and the gate pad portion is formed by the gate pad electrode and the gate contact electrode and the data pad portion is formed by the data pad electrode and the data contact electrode.

6. The flexible display device claimed as claim 4, wherein the outer area is between the cut lines of the neighboring TFT substrates.

7. A flexible display device comprising:
   a mother substrate having a cut line which divides the mother substrate into a plurality of TFT substrates;
   a barrier film disposed on the mother substrate;
   a gate line disposed on the barrier film;
   a data line defining a pixel by crossing the gate line;
   a TFT connected to the gate line and the data line;
   a gate pad electrode connected to the gate line and formed on a gate pad region;
   a data pad electrode connected to the data line and disposed on a data pad region;
   a pixel electrode connected to the TFT;
   a gate insulation film disposed under the data line and the data pad electrode;
   a protection film disposed on the pixel electrode;
   a gate contact electrode disposed in the gate pad region and connected to the gate pad electrode with the protection film interposed between the gate contact electrode and the gate pad electrode; and
   a data contact electrode disposed in the data pad region and connected to the data pad electrode with the protection film interposed between the data contact electrode and the data pad electrode,
   wherein the gate insulation film, the gate pad electrode, the data pad electrode, the protection film, the gate pad electrode, and the data pad electrode are not on the mother substrate in the area in the vicinity of the cut line.

8. The flexible display device claimed as claim 7, wherein the mother substrate is made of flexible stainless steel.

9. The flexible display device claimed as claim 7, wherein the vicinity of the cut line comprises an inner area and an outer area.

10. The flexible display device claimed as claim 9, wherein the inner area is an area between the cut line and a gate pad portion or a data pad portion, and the gate pad portion is formed by the gate pad electrode and the gate contact electrode and the data pad portion is formed by the data pad electrode and the data contact electrode.

11. The flexible display device claimed as claim 9, wherein the outer area is between the cut lines of the neighboring TFT substrates.

12. A method of manufacturing a flexible display device, the method comprising the steps of:

providing a mother substrate having a cut line along which the mother substrate is cut into a plurality of TFT substrates;

forming a barrier film on the mother substrate and removing the barrier film from an area in the vicinity of the cut line;

forming a gate line, a gate electrode, and a gate pad electrode on the barrier film and removing the gate pad electrode from the area in the vicinity of the cut line;

forming a gate insulation film on the mother substrate including the gate line, the gate electrode, and the gate pad electrode and removing the gate pad electrode from the area in the vicinity of the cut line;

forming a data line, source and drain electrodes, and a data pad electrode on the gate insulation film and removing the data pad electrode from the area in the vicinity of the cut line;

forming a protection film having at least one contact hole on the mother substrate including the data line, the source and drain electrodes, and the data pad electrode and removing the protection film from the area in the vicinity of the cut line; and forming a pixel electrode, a gate contact electrode, and a data contact electrode on the protection film and removing the gate contact electrode and the data contact electrode from the area in the vicinity of the cut line.

13. The method claimed as claim 12, wherein, when the at least one contact hole is formed, the protection film is removed from the vicinity of the cut line.

14. The method claimed as claim 12, wherein the mother substrate is formed of flexible stainless steel.

15. A method of manufacturing a flexible display device, the method comprising the steps of:

providing a mother substrate having a cut line along which the mother substrate is cut into a plurality of TFT substrates;

forming a barrier film on the mother substrate;

forming a gate line, a gate electrode, and a gate pad electrode on the barrier film and removing the gate pad electrode from the area in the vicinity of the cut line;

forming a gate insulation film on the mother substrate including the gate line, the gate electrode, and the gate pad electrode and removing the gate pad electrode from the area in the vicinity of the cut line;

forming a data line, source and drain electrodes, and a data pad electrode on the gate insulation film and removing the data pad electrode from the area in the vicinity of the cut line;

forming a protection film having at least one contact hole on the mother substrate including the data line, the source and drain electrodes, and the data pad electrode and removing the protection film from the area in the vicinity of the cut line; and forming a pixel electrode, a gate contact electrode, and a data contact electrode on the protection film and removing the gate contact electrode and the data contact electrode from the area in the vicinity of the cut line.

16. The method claimed as claim 15, wherein the barrier film is formed on the mother substrate in the vicinity of the cut line.

17. The method claimed as claim 15, wherein the mother substrate is formed of flexible stainless steel.

* * * * *